United States Patent
Hu et al.

(10) Patent No.: US 10,247,772 B2
(45) Date of Patent: Apr. 2, 2019

(54) POSITION CALIBRATION METHOD, TEST CIRCUIT BOARD, SAMPLE PANEL AND POSITION CALIBRATION APPARATUS

(71) Applicant: BOE TECHNOLOGY GROUP CO., LTD., Beijing (CN)

(72) Inventors: Lei Hu, Beijing (CN); Hui Zhao, Beijing (CN); Wenjing Tan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 302 days.

(21) Appl. No.: 15/159,181

(22) Filed: May 19, 2016

(65) Prior Publication Data

US 2017/0052214 A1 Feb. 23, 2017

(30) Foreign Application Priority Data

Aug. 20, 2015 (CN) .......................... 2015 1 0515942

(51) Int. Cl.
| | | |
|---|---|---|
| *G01R 1/04* | (2006.01) | |
| *G01R 31/00* | (2006.01) | |
| *G01R 31/02* | (2006.01) | |
| *G01R 31/28* | (2006.01) | |

(52) U.S. Cl.
CPC ................ *G01R 31/2808* (2013.01)

(58) Field of Classification Search
CPC ................................. G01R 31/2808
See application file for complete search history.

(56) References Cited

U.S. PATENT DOCUMENTS

| 5,538,436 A | * | 7/1996 | Garney | ................ H05K 5/0265 |
| | | | | 361/679.32 |
| 9,772,349 B1 | * | 9/2017 | Michalko | ........... G01R 31/2818 |
| 2002/0191835 A1 | | 12/2002 | Lu et al. | |

(Continued)

FOREIGN PATENT DOCUMENTS

| CN | 101170096 A | 4/2008 |
| CN | 101655534 A | 2/2010 |
| CN | 101692329 A | 4/2010 |

OTHER PUBLICATIONS

First Office Action dated Jun. 19, 2017 corresponding to Chinese application No. 201510515942.8.

*Primary Examiner* — Huy Q Phan
*Assistant Examiner* — Zannatul Ferdous
(74) *Attorney, Agent, or Firm* — Nath, Goldberg & Meyer; Joshua B. Goldberg; Daniel Bissing (57) ABSTRACT

The present invention discloses a position calibration method, a test circuit board, a sample panel and a position calibration apparatus. The position calibration method comprises: Step S1, providing a test circuit board and forming at least one first sample connecting finger; Step S2, making a sample panel comprising second sample connecting fingers corresponding to each first sample connecting finger; Step S3, bringing the test circuit board into contact with the sample panel; and Step S4, detecting whether each first sample connecting finger is electrically connected to a corresponding second sample connecting finger, and when any one of the first sample connecting fingers is detected as in disconnection with the corresponding second sample connecting finger, adjusting a position of the test circuit board and/or the sample panel.

15 Claims, 4 Drawing Sheets

(56) References Cited

U.S. PATENT DOCUMENTS

| | | | |
|---|---|---|---|
| 2006/0202359 A1 | 9/2006 | Chen | |
| 2010/0052719 A1* | 3/2010 | Chiu | G01R 1/0416 |
| | | | 324/760.01 |
| 2010/0193974 A1 | 8/2010 | Wang | |
| 2011/0273203 A1* | 11/2011 | Romanov | G01R 31/2805 |
| | | | 324/763.01 |
| 2015/0201532 A1* | 7/2015 | Soyano | H05K 9/0037 |
| | | | 361/752 |

* cited by examiner

POSITION CALIBRATION METHOD, TEST CIRCUIT BOARD, SAMPLE PANEL AND POSITION CALIBRATION APPARATUS

FIELD OF THE INVENTION

The present invention relates to the field of display technology, and particularly relates to a position calibration method, a test circuit board, a sample panel and a position calibration apparatus.

BACKGROUND OF THE INVENTION

Figure 1:
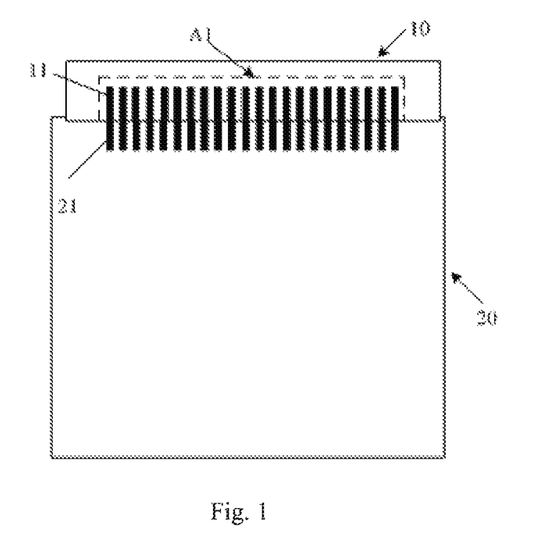
FIG. 1 is a schematic view showing a standard positional relationship between a prior test circuit board and a to-be-tested display panel when testing the to-be-tested display panel in prior art.

Display panels need to be tested after being produced, i.e., conducting a test circuit board (a flexible printed circuit (FPC) in the display apparatus that is matched to the display panel) with a to-be-tested display panel to determine whether the display panel is non-defective according to a display situation thereof. Usually, the to-be-tested display panel is secured on a securing platform of a test machine during the detection. The test circuit board is secured on a pressure head of the test machine that is pressed downward while an operator calibrates a position of the test circuit board with the naked eye, so that a plurality of first connecting fingers 11 on the test circuit board 10 contact a plurality of second connecting fingers 21 on the to-be-tested display panel 20 one by one, as shown in FIG. 1, thereby conducting the test circuit board 10 with the display panel 20. However, the method of calibrating through the naked eye of an operator s low in efficiency and accuracy, and tends to cause a short circuit between the test circuit board and the display panel.

SUMMARY OF THE INVENTION

The present invention has been accomplished in order to solve the above problems and it is an object thereof to provide a position calibration method, a test circuit board, a sample panel and a position calibration apparatus that can calibrate positions of the test circuit board and the to-be-tested display panel quickly and accurately before the to-be-tested display panel is tested.

According to one aspect of the invention, there is provided a position calibration method for calibrating a position of a test circuit board and/or a to-be-tested display panel before the to-be-tested display panel is tested, the test circuit board comprising a first connecting finger setting region that is provided with a plurality of first connecting fingers therein, the to-be-tested display panel comprising a plurality of second connecting fingers corresponding to the plurality of first connecting fingers one by one, the position calibration method comprising:

Step S1, providing the test circuit board and forming at least one first sample connecting finger outside of the first connecting finger setting region of the test circuit board;

Step S2, making a sample panel comprising a second connecting finger setting region and a second sample connecting finger outside of the second connecting finger setting region corresponding to each of the first sample connecting fingers, so that when each of the first sample connecting fingers is aligned with a corresponding second sample connecting finger, the plurality of first connecting fingers are aligned with positions corresponding to the plurality of second connecting fingers within the second connecting finger setting region.

Step S3, bringing the test circuit board into contact with the sample panel; and Step S4, detecting whether each first sample connecting finger is electrically connected to a corresponding second sample connecting finger, and when any one of the first sample connecting fingers is detected as in disconnection with the corresponding second sample connecting finger, adjusting a position of the test circuit board and/or the sample panel until each first sample connecting finger is electrically connected to the corresponding second sample connecting finger, in which case, a position of the sample panel is a position of the to-be-tested display panel.

The Step S1 may comprise:

forming a first sample connecting finger at either side of the first connecting finger setting region respectively, and bringing the two first sample connecting fingers into electrical connection; and Step S4 may comprise:

Step S4a, when two second sample connecting fingers are electrically connected, detecting whether two second sample connecting fingers and two first sample connecting fingers form a conductive path; and Step S4b, when two second sample connecting fingers and two first sample connecting fingers do not form a conductive path, adjusting a position of the test circuit board and/or the sample panel until two second sample connecting fingers and two first sample connecting fingers form a conductive path.

The Step S4a may comprise:

detecting a resistance between two second sample connecting fingers, and determining that two second sample connecting fingers and two first sample connecting fingers do not form a conductive path when the detected resistance is infinite; otherwise, determining that two second sample connecting fingers and two first sample connecting fingers form a conductive path.

A distance between each first sample connecting finger and an adjacent first connecting finger may equal to a distance between two adjacent first connecting fingers.

Each second sample connecting finger may be provided with at least one standby connecting finger at either side thereof respectively, and the Step S4 comprises:

when any one of the first sample connecting fingers is disconnected with the corresponding second sample connecting finger, detecting which standby connecting finger is electrically connected with the first sample connecting finger; and when the first sample connecting finger is electrically connected with a standby connecting finger at a first side of the corresponding second sample connecting finger, moving the test circuit board towards a second side of the sample panel; and when the first sample connecting finger is electrically connected with a standby connecting finger at the second side of the corresponding second sample connecting finger, moving the test circuit board towards the first side of the sample panel.

The Step S2 may comprise:

Step S2a, providing a base substrate corresponding to the to-be-tested display panel;

Step S2b, forming a second sample connecting finger corresponding to each first sample connecting finger on the base substrate; and Step S2c, forming at least one standby connecting finger at either side of each second sample connecting finger respectively.

A distance between each second sample connecting finger and an adjacent standby connecting finger thereof may equal to a distance between two adjacent second connecting fingers in the to-be-tested display panel.

The Step S2 may further comprise:

forming a sample test section that is electrically connected to each second sample connecting finger, and a standby test section that is electrically connected to each standby connecting finger.

According to another aspect of the invention, there is provided a test circuit board for testing a to-be-tested display panel, comprising: a first connecting finger setting region that is provided with a plurality of first connecting fingers, and the test circuit board further comprises at least one first sample connecting finger that is provided outside of the first connecting finger setting region.

The test circuit board may comprise two first sample connecting fingers that are electrically connected to each other, the two first sample connecting fingers being disposed at two sides of the first connecting finger setting region respectively.

A distance between each first sample connecting finger and an adjacent first connecting finger thereof may equal to a distance between two adjacent first connecting fingers.

According to yet another aspect of the invention, there is provided a sample panel for determining a position of a to-be-tested display panel before the to-be-tested display panel is tested by a test circuit board, wherein the test circuit board is the above discussed test circuit board, the to-be-tested display panel comprises a plurality of second connecting fingers corresponding to the plurality of first connecting fingers one by one, and the sample panel comprises a second connecting finger setting region and a second sample connecting finger outside of the second connecting finger setting region corresponding to each of the first sample connecting fingers, so that when each of the first sample connecting fingers is aligned with a corresponding second sample connecting finger, the plurality of first connecting fingers are aligned with positions corresponding to the plurality of second connecting fingers within the second connecting finger setting region.

Each second sample connecting finger may be provided with at least one standby connecting finger at either side thereof respectively, and a distance between each second sample connecting finger and an adjacent standby connecting finger thereof equals to a distance between two adjacent second connecting fingers in the to-be-tested display panel.

The sample panel may further comprise a sample test section that is electrically connected to each second sample connecting finger and a standby test section that is electrically connected to each standby connecting finger.

According to yet another aspect of the invention, there is provided a position calibration apparatus for calibrating a position of a test circuit board and/or a to-be-tested display panel before the to-be-tested display panel is tested, wherein the position calibration apparatus comprises the above discussed test circuit board and above discussed sample panel, the to-be-tested display panel comprising a plurality of second connecting fingers corresponding to the plurality of first connecting fingers on the test circuit board one by one, and the position calibration apparatus further comprising:

a detection module for detecting whether each first sample connecting finger is electrically connected to a corresponding second sample connecting finger when the test circuit board and the sample panel are in contact, a position of the sample panel being a position of the to-be-tested display panel when each first sample connecting finger is electrically connected to the corresponding second sample connecting finger.

The test circuit board may comprise two first sample connecting fingers that are electrically connected to each other and respectively disposed at either side of the first connecting finger setting region, and the detection module comprises two connecting ends that are respectively connectable with two second sample connecting fingers such that the detection module detects whether two second sample connecting fingers and two first sample connecting fingers form a conductive path.

Each second sample connecting finger is provided with at least one standby connecting finger at either side thereof respectively, and when any one of the first sample connecting fingers is disconnected with the corresponding second sample connecting finger, the detection module may detect a position of a standby connecting finger that is electrically connected to the first sample connecting finger.

The position calibration apparatus may further comprise a securing platform, a pressure head, a first securing means for securing the test circuit board on the pressure head and a second securing means for securing the sample panel or the to-be-tested display panel on the securing platform, the pressure head being movable along a direction approaching or away from the securing platform.

The first securing means may comprise a plurality of first securing columns that include an upstanding portion and a hold-down portion disposed at the top of the upstanding portion, the pressure head is provided with securing holes, and the test circuit board is provided with apertures, the bottom of the upstanding portion can pass through the aperture to be secured in the securing hole, and the aperture has a diameter that is greater than the diameter of the securing hole and smaller than the diameter of the hold-down portion.

The second securing means may comprise a plurality of second securing columns provided on the securing platform, and both of the sample panel and the to-be-tested display panel can be secured within a region defined by the plurality of second securing columns.

BRIEF DESCRIPTION OF THE DRAWINGS

Accompanying drawings are provided for further understanding of this disclosure and constituting a part of the specification. Hereinafter, these drawings are intended to explain the disclosure together with the following specific embodiments, but should not be considered as a limitation of the disclosure. In the drawings.

REFERENCE SIGNS

10 test circuit board in the prior art; 11 first connecting finger; 20 to-be-tested display panel; 21 second connecting finger; 30 test circuit board according to the invention; A1 first connecting finger setting region; 31 first sample connecting finger; 34 conductive pattern; 40 sample panel; A2 second connecting finger setting region; 41 second sample connecting finger; 42 standby connecting finger; 43 sample test section; 44 standby test section; 51 securing platform; 52 pressure head; 61 first securing column; and 62 second securing column.

Detailed Description Of The Embodiments

Hereinafter, specific embodiments of the disclosure will be described in detail in conjunction with the accompanying drawings. It should be understood that the specific embodiments as set forth herein are merely for the purpose of illustration and explanation of the disclosure and should not be constructed as a limitation thereof.

According to one aspect of the invention, there is provided a position calibration method for calibrating a position of a test circuit board and/or a to-be-tested display panel before the to-be-tested display panel is tested.

Figure 2:
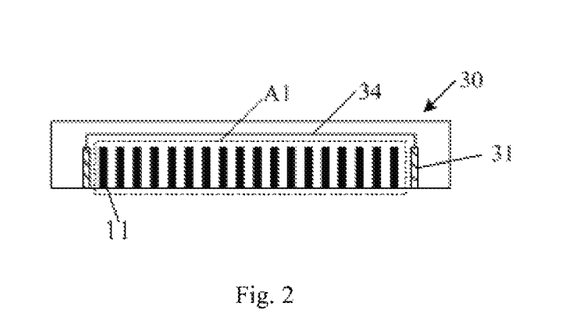
FIG. 2 is a structural schematic view of a test circuit board according to the embodiment of the present invention.
Figure 3:
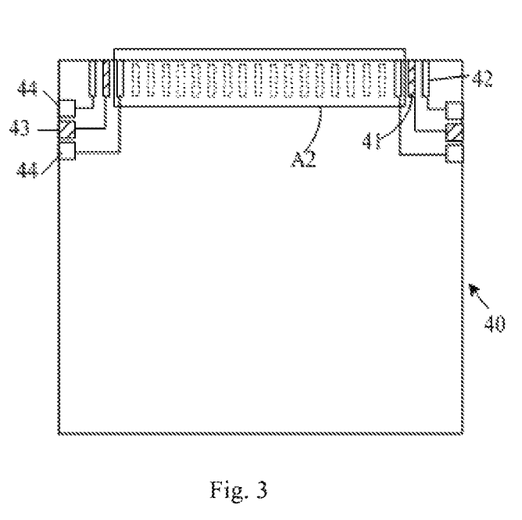
FIG. 3 is a structural schematic view of a sample panel according to the embodiment of the present invention.

As shown in FIGS. 1-2, the test circuit board 30 comprises a first connecting finger setting region (the dashed box A1 shown in FIG. 2) that is provided with a plurality of first connecting fingers 11. The to-be-tested display panel 20 comprises a plurality of second connecting fingers 21 corresponding to the plurality of first connecting fingers 11 one by one. The position calibration method comprises:

Step S1, providing the test circuit board 30 and, as shown in FIG. 2, forming at least one first sample connecting finger 31 outside of the first connecting finger setting region of the test circuit board;

Step S2, as shown in FIG. 3, making a sample panel 40 comprising a second connecting finger setting region A2 and a second sample connecting finger 41 outside of the second connecting finger setting region A2 corresponding to each of the first sample connecting fingers 31, so that when each of the first sample connecting fingers 31 is aligned with a corresponding second sample connecting finger 41, the plurality of first connecting fingers 11 are aligned with positions (the dashed box shown in FIG. 3) corresponding to the plurality of second connecting fingers 21 within the second connecting finger setting region A2.

Figure 4:
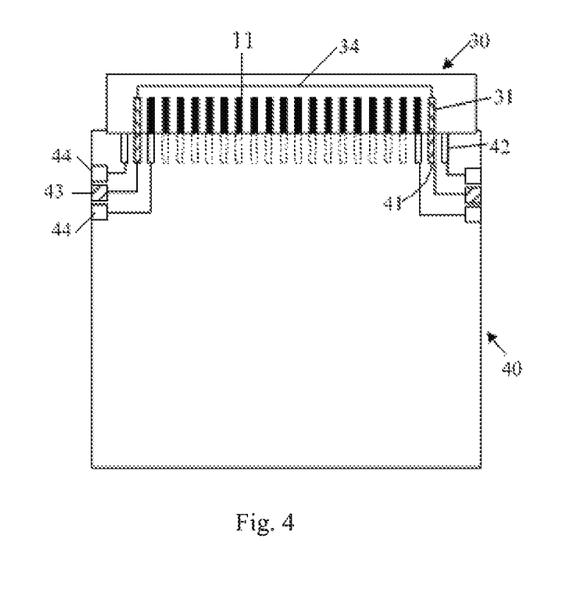
FIG. 4 is a schematic view showing the case in which the test circuit board and the sample panel according to the embodiment of the present invention contact each other.

Step S3, as shown in FIG. 4, bringing the test circuit board 30 into contact with the sample panel 40; and Step S4, detecting whether each first sample connecting finger 31 is electrically connected to a corresponding second sample connecting finger 41, and when any one of the first sample connecting fingers 31 is detected as in disconnection (without any point connection) with the corresponding second sample connecting finger 41, adjusting a position of the test circuit board 30 and/or the sample panel 40 until each first sample connecting finger 31 is electrically connected to the corresponding second sample connecting finger 41, in which case, a position of the sample panel 40 is a position of the to-be-tested display panel 20.

It should be understood that the sample panel 40 and the to-be-tested display panel 20 correspond to each other, i.e., the size and shape of the two are the same. The second connecting finger setting region A2 is provided with a plurality of setting positions (the dashed box shown in FIG. 3) to which positions of the plurality of second connecting fingers 21 on the to-be-tested display panel 20 correspond one by one. However, since the sample panel 40 is only used for determining a position of the to-be-tested display panel 20, the second connecting finger setting region A2 may include no second connecting finger 21. It only needs to ensure that the plurality of first connecting fingers 11 are aligned with positions corresponding to the second connecting fingers 21 on the sample panel 40 when each first sample connecting finger 31 contacts a corresponding second sample connecting finger 41.

Since the test circuit board 30 is provided with a first sample connecting finger 31, the sample panel 40 is provided with a second sample connecting finger 41, and when the first sample connecting linger 31 contacts the corresponding second sample connecting finger 41, the first connecting fingers 11 on the test circuit board 30 are aligned with positions corresponding to the second connecting fingers 21 on the sample panel 40, thus in the above discussed position calibration method, when the test circuit board 30 contacts the sample panel 40, the position of the to-be-tested display panel 20 can be determined as long as each first sample connecting finger 31 is electrically connected to a corresponding second sample connecting finger 41. When any one of the sample connecting fingers 31 is disconnected with the corresponding second sample connecting finger 41, a position of the test circuit board 30 and/or the sample panel 40 needs to be adjusted until all the first sample connecting fingers 31 are conductive with corresponding second sample connecting fingers 41. In subsequent tests, it can ensure that the first connecting fingers 11 on the test circuit board 30 are aligned with the second connecting fingers 21 on the to-be-tested display panel 20 one by one as long as the to-be-tested display panel 20 is placed on the position of the sample panel 40, thereby enabling quick and accurate calibration of positions of the test circuit board 30 and the to-be-tested display panel 20, preventing problems such as dislocation of connecting fingers on the test circuit board 30 and the to-be-tested display panel 20 during test, and further improving the detection efficiency and effect.

In practical production, a plurality of display panels of the same batch have the same specification. Therefore, the same test circuit board may be used to test a plurality of to-be-tested display panels, each of which has the same position with the sample panel.

In one embodiment of the invention, as shown in FIG. 2, Step S1 comprises forming a first sample connecting finger 31 at either side of the first connecting finger setting region A1 respectively, and bringing the two first sample connecting fingers 31 into electrical connection. Specifically, a conductive pattern 34 connecting the two first sample connecting fingers 31 may be formed while forming the two first sample connecting fingers 31.

In addition, Step S4 comprises:

Step S4a, when two second sample connecting fingers 41 are electrically connected, detecting whether two second sample connecting fingers 41 and two first sample connecting fingers 31 form a conductive path; and Step S4b, when two second sample connecting fingers 41 and two first sample connecting fingers 31 do not form a conductive path, adjusting a position of the test circuit board 30 and/or the sample panel 40 until two second sample connecting fingers 41 and two first sample connecting fingers 31 form a conductive path.

When the test circuit board 30 is in contact with the sample panel 40 and two second sample connecting fingers 41 and two first sample connecting fingers 31 form a conductive path, it indicates that positions corresponding to the first connecting fingers 11 on the test circuit board 30 are aligned with positions corresponding to second connecting fingers 21 on the sample panel 40 one by one. Therefore, there is no need to provide too many first sample connecting fingers 31 or second sample connecting fingers 41.

Two second sample connecting fingers 41 and two first sample connecting fingers 31 forming a conductive path means two second sample connecting fingers 41 and two first sample connecting fingers 31 are electrically connected in series. That is, when two second sample connecting fingers 41 are respectively connected to positive and negative electrodes of a power, there will be current going through between the two sample connecting fingers 41.

The specific process of Step S4a is not restricted, for example, a power, a resistance and an ampere meter (or indicator light) may be applied between two second sample connecting fingers 41. When the ampere meter detects current passing (or the indicator light is on), it indicates the first sample connecting finger 31 and the second sample connecting finger 41 form a conductive path. In the embodiment of the invention, whether a conductive path is formed between two second sample connecting fingers 41 and two first sample connecting fingers 31 may be determined by detecting the resistance. Specifically, Step S4a comprises:

detecting a resistance between two second sample connecting fingers 41, and determining that two second sample connecting fingers 41 and two first sample connecting fingers 31 do not form a conductive path when the detected resistance is infinite; otherwise, determining that two second sample connecting fingers 41 and two first sample connecting fingers 31 form a conductive path.

Those skilled in the art should understand that a multimeter with a measuring range from zero to infinite (∞) may be used to detect the resistance. When two second sample connecting fingers 41 and two first sample connecting fingers 31 form an open circuit, the resistance between two second sample connecting fingers 41 is infinite, and when two second sample connecting fingers 41 and two first sample connecting fingers 31 form a conductive path, the resistance between two second sample connecting fingers 41 is very small (not infinite). The method of determining by detecting resistance is simple and convenient, which requires, for example, no separate power and resistance, but directly uses a multimeter to detect the resistance instead to determine whether a conductive path is formed between two second sample connecting fingers 41 and two first sample connecting fingers 31, i.e., determining whether each first sample connecting finger 31 is aligned with the corresponding second sample connecting finger 41. Such method requires no separate power-on test and thus may prevent a short circuit from occurring.

In one embodiment of the invention, as shown in FIG. 2, a distance between each first sample connecting finger 31 and an adjacent first connecting finger 11 equals to a distance between two adjacent first connecting fingers 11, so that the first sample connecting finger 31 and the first connecting finger 11 can be made uniformly, thereby reducing manufacturing costs.

In one embodiment of the invention, as shown in FIG. 3, at least one standby connecting finger 42 is provided at either side of each second sample connecting finger 41 respectively, and the Step S4 comprises:

when any one of the first sample connecting fingers 31 is disconnected with the corresponding second sample connecting finger 41, detecting which standby connecting finger 42 is electrically connected with the first sample connecting finger 31; and when the first sample connecting finger 31 is electrically connected with a standby connecting finger 42 at a first side (left or right side) of the corresponding second sample connecting finger 41, moving the test circuit board 30 towards a second side (right or left side) of the sample panel 40; and when the first sample connecting finger 31 is electrically connected with a standby connecting finger 42 at the second side of the corresponding second sample connecting finger 41, moving the test circuit board 30 towards the first side of the sample panel 40.

Therefore, according to which standby connecting finger 42 is conductive with the first sample connecting finger 31, a deviation position of the test circuit board 30 relative to the sample panel 40 can be determined, thereby facilitating determining an adjusting direction of the test circuit board 30 and/or the sample panel 40.

As discussed above, the test circuit board 30 is provided with two first sample connecting fingers 31 and the sample panel 40 is provided with two second sample connecting fingers 41. In such case, a plurality of standby connecting fingers 42 at two sides of a first second sample connecting finger 41 correspond to a plurality of standby connecting fingers 42 at two sides of a second second sample connecting finger 41. A distance between a pair of corresponding standby connecting fingers 42 equals to a distance between two second sample connecting fingers 41. Specifically, as shown in FIG. 3, each second sample connecting finger 41 is provided with a standby connecting finger 42 at the left and right sides thereof respectively. A distance between two standby connecting fingers 42 at the left side of two second sample connecting fingers 41 equals to a distance between two second sample connecting fingers 41, and a distance between two standby connecting fingers 42 at the right side of two second sample connecting fingers 41 also equals to the distance between two second sample connecting fingers 41. When any one of the first sample connecting fingers 31 is disconnected with the corresponding second sample connecting finger 41, which two of the standby connecting fingers 42 form a conductive path with two first sample connecting fingers 31 may be detected. The test circuit board 30 is moved rightward when two standby connecting fingers 42 at the left side of two second sample connecting fingers 41 form a conductive path with two first sample connecting fingers 31; and the test circuit board 30 is moved leftward when two standby connecting fingers 42 at the right side of two second sample connecting fingers 41 form a conductive path with two first sample connecting fingers 31.

Specifically, Step S2 comprises:

Step S2a, providing a base substrate corresponding to the to-be-tested display panel 20, the base substrate having the same size and shape with the to-be-tested display panel 20.

Step S2b, forming a second sample connecting finger 41 corresponding to each first sample connecting finger 31 on the base substrate; and Step S2c, forming at least one standby connecting finger 42 at either side of each second sample connecting finger 41 respectively.

Further, a distance between each second sample connecting finger 41 and an adjacent standby connecting finger 42 thereof equals to a distance between two adjacent second connecting fingers 21 in the to-be-tested display panel 20. As shown in FIGS. 3 and 4, the distance between each second sample connecting finger 41 and an adjacent standby connecting finger 42 thereof equals to the distance between two dashed boxes.

Further, Step S2 also comprises: forming a sample test section 43 that is electrically connected to each second sample connecting finger 41, and a standby test section 44 that is electrically connected to each standby connecting finger 42. Since the second sample connecting finger 41 and the standby connecting finger 42 both have a smaller area, a sample test section 43 and a standby test section 44 with greater areas may be provided to facilitate detecting a resistance between two second sample connecting fingers 41 or two standby connecting fingers 42.

According to another aspect of the invention, there is provided a test circuit board for testing a to-be-tested display panel.

As shown in FIG. 2, the test circuit board 30 comprises a first connecting finger setting region A1 that is provided with a plurality of first connecting fingers 11, and at least one first sample connecting finger 31 that is provided outside of the first connecting finger setting region A1.

The position of the test circuit board 30 and/or the sample panel 40 may be adjusted before the to-be-tested display panel 20 is tested, such that the first sample connecting finger 31 on the test circuit board 30 is aligned with the second sample connecting finger 41 on the sample panel 40, thus in sequent tests, the first connecting finger 11 on the test circuit board 30 is aligned with the second connecting finger 21 on the to-be-tested display panel 20, thereby guaranteeing accuracy of the tests.

Specifically, as shown in FIG. 2, the test circuit board 30 comprises two first sample connecting fingers 31 that are electrically connected to each other, provided at either side of the first connecting finger setting region A1 respectively, and able to be electrically connected to each other via a conductive pattern 34.

Further, a distance between each first sample connecting finger 31 and an adjacent first connecting finger 11 thereof equals to a distance between two adjacent first connecting fingers 11.

According to yet another aspect of the invention, there is provided a sample panel for determining a position of a to-be-tested display panel before the to-be-tested display panel is tested by a test circuit board, wherein the test circuit board is the above discussed test circuit board and the to-be-tested display panel comprises a plurality of second connecting fingers corresponding to the plurality of first connecting fingers one by one.

As shown in FIG. 3, the sample panel 40 comprises a second connecting finger setting region A2 and a second sample connecting finger 41 outside of the second connecting finger setting region A2 corresponding to each first sample connecting finger 31 on the test circuit board 30, so that when each of the first sample connecting fingers 31 is aligned with a corresponding second sample connecting finger 41, a plurality of first connecting fingers 11 are aligned with positions (the dashed box shown in FIG. 3) corresponding to a plurality of second connecting fingers 21 within the second connecting finger setting region A2 one by one.

Therefore, before the to-be-tested display panel 20 is tested, the positions of the test circuit board 30 and the sample panel 40 are adjusted until each first sample connecting finger 31 is aligned with the corresponding second sample connecting finger 41. At this time, as shown in FIG. 4, the plurality of first connecting fingers 11 are aligned with positions corresponding to the plurality of second connecting fingers 21 on the sample panel 40 one by one, such that during the test, it can ensure that the plurality of first connecting fingers 11 are aligned with the plurality of second connecting fingers 21 in the to-be-tested display panel 20 one by one just by placing the to-be-tested display panel 20 at the position of the sample panel 40.

Further, as shown in FIG. 3, each second sample connecting fingers 41 is provided with at least one standby connecting finger 42 at either side thereof respectively. When any one of the first sample connecting fingers 31 is not aligned with the corresponding second sample connecting finger 41, the position of the standby connecting finger 42 that is electrically connected to the first sample connecting finger 31 is detected. When a standby connecting finger 42 at a first side (left or right side) of the second sample connecting finger 41 is detected as in electrical connection with the first sample connecting finger 31, the test circuit board 30 is moved towards a second side (right or left side) of the sample panel 40; and when a standby connecting finger 42 at the second side of the second sample connecting finger 41 is detected as in electrical connection with the first sample connecting finger 31, the test circuit board 30 is moved towards the first side of the sample panel 40.

Specifically, as shown in FIG. 3, a distance between each second sample connecting finger 41 and an adjacent standby connecting finger 42 thereof equals to a distance between two adjacent second connecting fingers 21 in the to-be-tested display panel 20.

Further, as shown in FIG. 3, the sample panel 40 also comprises a sample test section 43 that is electrically connected to each second sample connecting finger 41, and a standby test section 44 that is electrically connected to each standby connecting finger 42. The sample test section 43 has a greater area than the second sample connecting finger 41, and the standby test section 44 has a greater area than the standby connecting finger 42. As discussed above, when using a device such as a multimeter to detect a resistance between two second sample connecting fingers 41 or standby connecting fingers 42, a sample test section 43 or standby test section 44 with a greater area can facilitate detection of the resistance.

According to yet another aspect of the invention, there is provided a position calibration apparatus for calibrating a position of a test circuit board and/or a to-be-tested display panel before the to-be-tested display panel is tested, the position calibration apparatus comprising the above discussed test circuit board and above discussed sample panel, the to-be-tested display panel comprising a plurality of second connecting fingers corresponding to the plurality of first connecting fingers on the test circuit board one by one, and the position calibration apparatus further comprising:

a detection module for detecting whether each first sample connecting finger is electrically connected to a corresponding second sample connecting finger when the test circuit board and the sample panel are in contact, a position of the sample panel being a position of the to-be-tested display panel when each first sample connecting finger is electrically connected to the corresponding second sample connecting finger.

When using the position calibration apparatus to calibrate the position of the test circuit board and/or the to-be-tested display panel, the detection module detects whether the first sample connecting finger is conductive with the corresponding second sample connecting finger. When exists the case in which the first sample connecting finger is disconnected with the second sample connecting finger, the position of the sample panel and/or the test circuit board may be adjusted until each first sample connecting finger is conductive with the corresponding second sample connecting finger. At this time, the plurality of first connecting fingers on the test circuit board are aligned with positions corresponding to the plurality of second connecting fingers on the sample panel one by one. The to-be-tested display panel is placed at the position of the sample panel when the test begins, such that the first connecting fingers on the test circuit board are also aligned with the second connecting fingers on the to-be-tested display panel one by one, thereby enabling quick and accurate determination of positions of the test circuit board and the to-be-tested display panel and further improving detection efficiency and effects.

Specifically, as shown in FIG. 2, the test circuit board 30 comprise two first sample connecting fingers 31 that are electrically connected to each other and respectively disposed at either of the first connecting finger setting region A1. The detection module comprises two connecting ends that are respectively connectable with two second sample connecting fingers 41 such that the detection module detects whether two second sample connecting fingers 41 and two first sample connecting fingers 31 form a conductive path. When two second sample connecting fingers 41 and two first sample connecting fingers 31 form a conductive path, it indicates that each first sample connecting finger 31 is electrically connected to the corresponding second sample connecting finger 41.

Specifically, the detection module including a muitimeter is used for detecting a resistance between two second sample connecting fingers 41. Two probes of the multimeter form two connecting ends of the detection module. By detecting the resistance, whether two first sample connecting fingers 31 and two second sample connecting fingers 42 form a conductive path can be determined quickly without an external power, thereby preventing a short circuit from occurring. It should be understood that it indicates that two first sample connecting fingers 31 and two second sample connecting fingers 42 form an open circuit when the resistance between two second sample connecting fingers 41 is infinite; and that two first sample connecting fingers 31 and two second sample connecting fingers 42 form a conductive path when the resistance between two second sample connecting fingers 41 is very small.

As shown in FIGS. 3 and 4, each second sample connecting finger 41 is provided with at least one standby connecting finger 42 at either side thereof respectively, and when any one of the first sample connecting fingers 31 is disconnected with the corresponding second sample connecting finger 41, the detection module can detect a position of the standby connecting finger 42 that is electrically connected to the first sample connecting finger 31.

As shown in FIG. 4, the test circuit board 30 is provided with two first sample connecting fingers 31 and the sample panel 40 is provided with two second sample connecting fingers 41 each of which is provided with a standby connecting finger 42 at either side thereof. When the first sample connecting finger 31 is disconnected with the corresponding second sample connecting finger 41, the detection module may be used to detect which two of the standby connecting fingers 42 form a conductive path with the two first sample connecting fingers 31. When the two standby connecting fingers 42 respectively at the left side of the two second sample connecting fingers 41 are detected as forming a conductive path with the two first sample connecting fingers 31, it indicates that the test circuit board 30 is relatively left to the sample panel 40, thus the test circuit board 30 may be moved towards the right side of the sample panel 40; and when the two standby connecting fingers 42 respectively at the right side of the two second sample connecting fingers 41 are detected as forming a conductive path with the two first sample connecting fingers 31, it indicates that the test circuit board 30 is relatively right to the sample panel 40, thus the test circuit board 30 may be moved towards the left side of the sample panel 40.

When the detection module comprises a multimeter, the multimeter may be used to detect a resistance between a pair of corresponding standby connecting fingers 42 (a distance between which equals to a distance between two second sample connecting fingers 41). When the resistance between the two standby connecting fingers 42 is very small (for example, zero or close to zero), it indicates that the two standby connecting fingers 42 can form a conductive path with two first sample connecting fingers 31, i.e., the two standby connecting fingers 42 correspond to the two first sample connecting fingers 31 one by one.

It should be understood that when the test circuit board 30 comprises two first sample connecting fingers 31 and the sample panel 40 comprises two second sample connecting fingers 41, the distance between the two first sample connecting fingers 31 equals to the distance between the two second sample connecting fingers 41, and when one of the first sample connecting fingers 31 is not aligned with the corresponding second sample connecting finger 41, the other first sample connecting finger 31 is not aligned with the corresponding second sample connecting finger 41, either.

As shown in FIG. 3, each second sample connecting finger 41 is provided with a standby connecting finger 42 at either side thereof respectively. Then, the two standby connecting fingers 42 at the left side of two second sample connecting fingers 42 respectively correspond to each other, and the two standby connecting fingers 42 at the right side of two second sample connecting fingers 42 respectively correspond to each other, too. At this time, a distance between a pair of corresponding standby connecting lingers 42 equals to a distance between two second sample connecting fingers 41. Those skilled in the art shall understand that the number of standby connecting fingers 42 at two sides of each second sample connecting finger 41 may be other numbers.

Further, as shown in FIG. 3, the sample panel 40 also comprises a sample test section 43 that is electrically connected to each second sample connecting finger 41, and a standby test section 44 that is electrically connected to each standby connecting finger 42. Since the areas of the second sample connecting finger 41 and the standby connecting finger 42 are usually small, when detecting whether the circuit is conductive by detecting a resistance with a multimeter, the multimeter is hard to come into contact with the second sample connecting finger 41 and the standby connecting finger 42 accurately. Therefore, a sample test section 43 and a standby test section 44 with greater areas may be provided. Two ends of the detection module are electrically connected to the second sample connecting finger 41 via contacting the sample test section 43, and electrically connected to the standby connecting finger 42 via contacting the standby test section 44.

Figure 5:
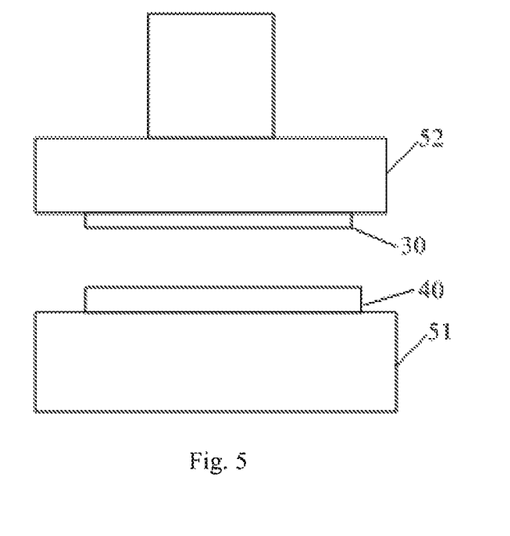
FIG. 5 is a side view of the pressure head and the securing platform according to the embodiment of the present invention.

Further, as shown in FIG. 5, the position calibration apparatus further comprises a securing platform 51, a pressure head 52, a first securing means for securing the test circuit board 30 on the pressure head 52 and a second securing means for securing the sample panel 40 or the to-be-tested display panel 20 on the securing platform 51. The pressure head 52 is movable along a direction approaching or away from the securing platform 51 so that the test circuit board 30 comes into contact with the sample panel 40.

Figure 6:
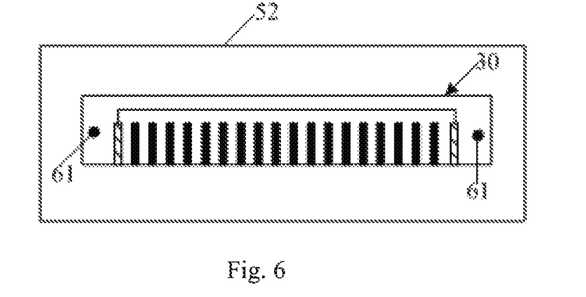
FIG. 6 is a bottom view of the pressure head according to the embodiment of the present invention when the test circuit board is provided on the pressure head.

Specifically, as shown in FIG. 6, the first securing means comprises a plurality of first securing columns 61 that include an upstanding portion and a hold-down portion disposed at the top of the upstanding portion, the pressure head 52 is provided with securing holes, and the test circuit board 30 is provided with apertures. The bottom of the upstanding portion can pass through the aperture to be secured in the securing hole, and the aperture has a diameter that is greater than the diameter of the securing hole and smaller than the diameter of the hold-down portion.

When the bottom of the upstanding portion is secured in the securing hole, the pressure function of the hold-down portion can secure the test circuit board 30 onto the pressure head 52. When the first sample connecting finger 31 on the test circuit board 30 is not electrically connected to the second sample connecting finger 41 on the sample panel 40, the first securing column 61 may be extracted partially from the securing hole so that the hold-down portion loosens the test circuit board 30 and the position of the test circuit board 30 can be adjusted by simply moving the test circuit board 30.

It should be understood that since the diameter of the aperture is greater than the diameter of the securing hole, and the desired adjustment range is usually very small when the test circuit board 30 and the sample panel 40 are not perfectly aligned, the first securing column may keep being through the aperture and secured in the securing hole before and after the adjustment. After adjusting and securing the position of the test circuit board 30, it only needs to take the sample panel 40 off the securing platform 51 and replace the sample panel 40 with the to-be-tested display panel 20.

Figure 7:
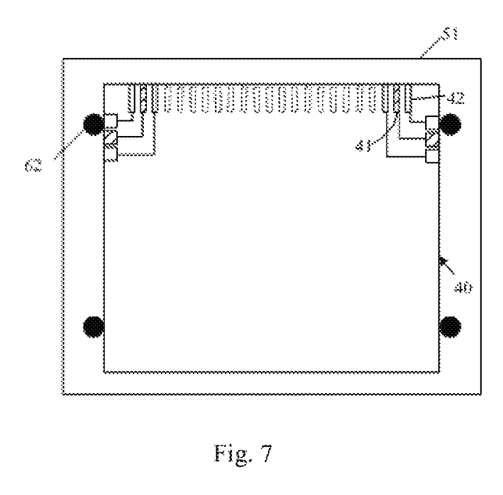
FIG. 7 is a plan view of a securing platform according to the embodiment of the present invention when the sample panel is provided on the securing platform.

Specifically, as shown in FIG. 7, the second securing means comprises a plurality of second securing columns 62 provided on the securing platform 51, and both of the sample panel 40 and the to-be-tested display panel 20 can be secured within a region defined by the plurality of second securing columns 62.

Since the first sample connecting finger 31 on the test circuit board 30 and the second sample connecting finger 41 on the sample panel 40 are aligned, when the to-be-tested display panel 20 is placed at the position of the sample panel 40, the first connecting finger 11 on the test circuit board 30 and the second connecting finger 21 on the to-be-tested display panel 20 are also aligned to each other. By this way, the accuracy of detection is improved.

It should be understood that the above embodiments are merely exemplary embodiments for the purpose of illustrating the principle of the invention, and the invention is not limited thereto. Various modifications and improvements can be made by a person having ordinary skill in the art without departing from the spirit and essence of the disclosure. Accordingly, all of the modifications and improvements also fall into the protection scope of the invention.

The invention claimed is:

1. A position calibration method for calibrating a position of a test circuit board and/or a to-be-tested display panel before the to-be-tested display panel is tested, the position calibration method comprising:
    Step S1, providing the test circuit board and forming at least one first sample connecting finger outside of a first connecting finger setting region of the test circuit board;
    Step S2, making a sample panel comprising a second connecting finger setting region and a second sample connecting finger outside of the second connecting finger setting region corresponding to each of the first sample connecting fingers, so that when each of the first sample connecting fingers is aligned with a corresponding second sample connecting finger, a plurality of first connecting fingers provided in the first connecting finger setting region are aligned with positions corresponding to a plurality of second connecting fingers on the to-be-tested display panel within the second connecting finger setting region;
    Step S3, bringing the test circuit board into contact with the sample panel; and
    Step S4, detecting whether each first sample connecting finger is electrically connected to a corresponding second sample connecting finger, and when any one of the first sample connecting fingers is detected as in disconnection with the corresponding second sample connecting finger, adjusting a position of the test circuit board and/or the sample panel until each first sample connecting finger is electrically connected to the corresponding second sample connecting finger, in which case, a position of the sample panel is a position of the to-be-tested display panel,
wherein each second sample connecting finger is provided with at least one standby connecting finger at either side thereof respectively, and the Step S4 comprises:
when any one of the first sample connecting fingers is disconnected with the corresponding second sample connecting finger, detecting which standby connecting finger is electrically connected with the first sample connecting finger; and
when the first sample connecting finger is electrically connected with a standby connecting finger at a first side of the corresponding second sample connecting finger, moving the test circuit board towards a second side of the sample panel; and when the first sample connecting finger is electrically connected with a standby connecting finger at the second side of the corresponding second sample connecting finger, moving the test circuit board towards the first side of the sample panel.

2. The position calibration method according to claim 1, wherein the Step Si comprises:
forming a first sample connecting finger at either side of the first connecting finger setting region resppctively, and bringing the two first sample connecting fingers into electrical connection; and
the Step S4 comprises:
Step S4a, when two second sample connecting fingers are electrically connected, detecting whether the two second sample connecting fingers and the two first sample connecting fingers form a conductive path; and
Step S4b, when the two second sample connecting fingers and the two first sample connecting fingers do not form a conductive path, adjusting a position of the test circuit board and/or the sample panel, until two second sample connecting fingers and two first sample connecting fingers form a conductive path.

3. The position calibration method according to claim 2, wherein the Step S4a comprises:
detecting a resistance between two second sample connecting fingers, and determining that two second sample connecting fingers and two first sample connecting fingers do not form a conductive path when the detected resistance is infinite; otherwise, determining that two second sample connecting fingers and two first sample connecting fingers form a conductive path.

4. The position calibration method according to claim 1, wherein a distance between each first sample connecting finger and an adjacent first connecting finger thereof equals to a distance between two adjacent first connecting fingers.

5. The position calibration method according to claim 1, wherein the Step S2 comprises:
Step S2a, providing a base substrate corresponding to the to-be-tested display panel;

Step S2b, forming a second sample connecting finger corresponding to each first sample connecting finger on the base substrate; and Step S2c, forming at least one standby connecting finger at either side of each second sample connecting finger respectively.

6. The position calibration method according to claim 5, wherein a distance between each second sample connecting finger and an adjacent standby connecting finger thereof equals to a distance between two adjacent second connecting fingers in the to-be-tested display panel.

7. The position calibration method according to claim 5, wherein the Step S2 further comprises:

forming a sample test section that is electrically connected to each second sample connecting finger, and a standby test section that is electrically connected to each standby connecting finger.

8. A position calibration apparatus for calibrating a position of a test circuit board and/or a to-be-tested display panel before the to-be-tested display panel is tested, the position calibration apparatus comprising:

a test circuit board comprising a first connecting finger setting region that is provided with a plurality of first connecting fingers corresponding to a plurality of second connecting fingers on the to-be-tested display panel one by one, wherein the test circuit board further comprises at least one first sample connecting finger that is provided outside of the first connecting finger setting region;

a sample panel comprising a second connecting finger setting region and a second sample connecting finger outside of the second connecting finger setting region corresponding to each of the first sample connecting fingers, so that when each of the first sample connecting fingers is aligned with a corresponding second sample connecting finger, the plurality of first connecting fingers are aligned with positions corresponding to the plurality of second connecting fingers within the second connecting finger setting region; and a detection module for detecting whether each first sample connecting finger is electrically connected to a corresponding second sample connecting finger when the test circuit board and the sample panel are in contact, a position of the sample panel being a position of the to-be-tested display panel when each first sample connecting finger is electrically connected to the corresponding second sample connecting finger, wherein each second sample connecting finger is provided with at least one standby connecting finger at either side thereof respectively, and when any one of the first sample connecting fingers is disconnected with the corresponding second sample connecting finger, the detection module detects that which standby connecting finger is electrically connected with the first sample connecting finger, when the detection module detects that the first sample connecting finger is electrically connected with a standby connecting finger at a first side of the corresponding second sample connecting finger, indicating to move the test circuit board towards a second side of the sample panel, and when the detection module detects that the first sample connecting finger is electrically connected with a standby connecting finger at the second side of the corresponding second sample connecting finger, indicating to move the test circuit board towards the first side of the sample panel.

9. The position calibration apparatus according to claim 8, wherein the test circuit board comprises two first sample connecting fingers that are electrically connected to each other and respectively disposed at either side of the first connecting finger setting region, and the detection module comprises two connecting ends that are respectively connectable with two second sample connecting fingers such that the detection module detects whether the two second sample connecting fingers and the two first sample connecting fingers form a conductive path.

10. The position calibration apparatus according to claim 8, wherein the position calibration apparatus further comprises a securing platform, a pressure head, a first securing means for securing the test circuit board on the pressure head and a second securing means for securing the sample panel or the to-be-tested display panel on the securing platform, the pressure head being movable along a direction approaching or away from the securing platform.

11. The position calibration apparatus according to claim 10, wherein the first securing means comprises a plurality of first securing columns that include an upstanding portion and a hold-down portion disposed at the top of the upstanding portion, the pressure head is provided with securing holes, and the test circuit board is provided with apertures, the bottom of the upstanding portion being able to pass through the aperture to be secured in the securing hole and the aperture having a diameter that is greater than the diameter of the securing hole and smaller than the diameter of the hold-down portion.

12. The position calibration apparatus according to claim 10, wherein the second securing means comprises a plurality of second securing columns provided on the securing platform, and both of the sample panel and the to-be-tested display panel is securable within a region defined by the plurality of second securing columns.

13. The position calibration apparatus according to claim 9, wherein a distance between each first sample connecting finger and an adjacent first connecting finger thereof equals to a distance between two adjacent first connecting fingers.

14. The position calibration apparatus according to claim 8, wherein a distance between each second sample connecting finger and an adjacent standby connecting finger thereof equals to a distance between two adjacent second connecting fingers in the to-be-tested display panel.

15. The position calibration apparatus according to claim 8, wherein the sample panel further comprises a sample test section that is electrically connected to each second sample connecting finger and a standby test section that is electrically connected to each standby connecting finger.

* * * * *